United States Patent
Athavale et al.

(10) Patent No.: US 11,830,849 B2
(45) Date of Patent: Nov. 28, 2023

(54) SEMICONDUCTOR DEVICE WITH UNBALANCED DIE STACKUP

(71) Applicant: Western Digital Technologies, Inc., San Jose, CA (US)

(72) Inventors: Saurabh Nilkanth Athavale, Milpitas, CA (US); Shrikar Bhagath, San Jose, CA (US); Pradeep Rai, Fremont, CA (US)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 99 days.

(21) Appl. No.: 17/519,261

(22) Filed: Nov. 4, 2021

(65) Prior Publication Data

US 2023/0133965 A1    May 4, 2023

(51) Int. Cl.
*H01L 25/065*     (2023.01)
*H01L 25/18*      (2023.01)
*H01L 23/00*      (2006.01)

(52) U.S. Cl.
CPC .......... *H01L 25/0652* (2013.01); *H01L 25/18* (2013.01); *H01L 24/48* (2013.01); *H01L 2224/48105* (2013.01); *H01L 2224/48145* (2013.01); *H01L 2224/48225* (2013.01); *H01L 2924/1433* (2013.01); *H01L 2924/14511* (2013.01)

(58) Field of Classification Search
CPC ...... H01L 25/0652; H01L 25/18; H01L 24/48
See application file for complete search history.

(56) References Cited

U.S. PATENT DOCUMENTS

| | | |
|---|---|---|
| 10,157,883 B2 | 12/2018 | Park et al. |
| 10,217,722 B2 | 2/2019 | Park |
| 10,262,972 B2 | 4/2019 | Lee et al. |
| 10,797,020 B2 | 10/2020 | Thurgood |
| 10,971,473 B2 | 4/2021 | Kosaka |
| 2018/0342481 A1* | 11/2018 | Lee .......... H01L 24/06 |
| 2020/0091102 A1* | 3/2020 | Aoki ........ H01L 24/04 |
| 2021/0249382 A1* | 8/2021 | Jeong ........ H01L 24/32 |
| 2022/0052021 A1* | 2/2022 | Fay .......... H01L 24/85 |

* cited by examiner

*Primary Examiner* — Errol V Fernandes
(74) *Attorney, Agent, or Firm* — Morgan, Lewis & Bockius LLP

(57) ABSTRACT

A semiconductor memory package includes a substrate, a first stack of memory dies, and a second stack of memory dies. The substrate includes a top layer and a bottom layer. The first stack of memory dies is electrically coupled to the top layer of the substrate and includes a controller and a first number of memory dies. The second stack of memory dies is electrically coupled to the top layer of the substrate and includes a second number of memory dies greater than the first number of memory dies. An upper surface of the first stack of memory dies and an upper surface of the second stack of memory dies are substantially coplanar.

20 Claims, 4 Drawing Sheets

SEMICONDUCTOR DEVICE WITH UNBALANCED DIE STACKUP

BACKGROUND

A semiconductor memory package may include a plurality of semiconductor memory dies and a controller packaged together on a substrate and encapsulated in a mold compound. The memory dies may be disposed in adjacent stacks, with the memory dies in each stack being electrically coupled to the substrate with respective pluralities of bond wires. The substrate includes communication lines that route electrical signals between the bond wires and the controller and to external connections.

As semiconductor memory packages continue to increase in storage capacity and decrease in size, the routing of electrical signals between the bond wires and the controller becomes more complicated. In addition, rearranging the memory dies within the package to address routing issues often creates wasted space, which can decrease the storage capacity of the package.

SUMMARY

The present disclosure describes a semiconductor memory package having unbalanced die stacks arranged in a configuration that increases storage capacity without increasing the size of the package.

In one aspect, a semiconductor memory package includes a substrate, a first stack of memory dies, and a second stack of memory dies. The first stack of memory dies is electrically coupled to a top layer of the substrate and includes a first number of memory dies. The second stack of memory dies is electrically coupled to the top layer of the substrate and includes a second number of memory dies greater than the first number of memory dies. An upper surface of the first stack of memory dies and an upper surface of the second stack of memory dies are coplanar or substantially coplanar. The semiconductor memory package further includes a controller mounted on and electrically coupled to the top layer of the substrate. The controller is included in the first stack of memory dies. The first stack of memory dies includes a bottom memory die mounted on the controller and a top memory die having an upper surface that is coplanar or substantially coplanar with the upper surface of the second stack of memory dies.

BRIEF DESCRIPTION OF THE DRAWINGS

The foregoing summary, as well as the following detailed description, will be better understood when read in conjunction with the appended drawings. For the purpose of illustrating the present disclosure, there are shown in the drawings embodiments which are presently preferred, wherein like reference numerals indicate like elements throughout. It should be noted, however, that aspects of the present disclosure can be embodied in different forms and thus should not be construed as being limited to the illustrated embodiments set forth herein. The elements illustrated in the accompanying drawings are not necessarily drawn to scale, but rather, may have been exaggerated to highlight the important features of the subject matter therein. Furthermore, the drawings may have been simplified by omitting elements that are not necessarily needed for the understanding of the disclosed embodiments.

DETAILED DESCRIPTION

The present subject matter will now be described more fully hereinafter with reference to the accompanying Figures, in which representative embodiments are shown. The present subject matter can, however, be embodied in different forms and should not be construed as limited to the embodiments set forth herein. Rather, these embodiments are provided to describe and enable one of skill in the art.

Figure 1:
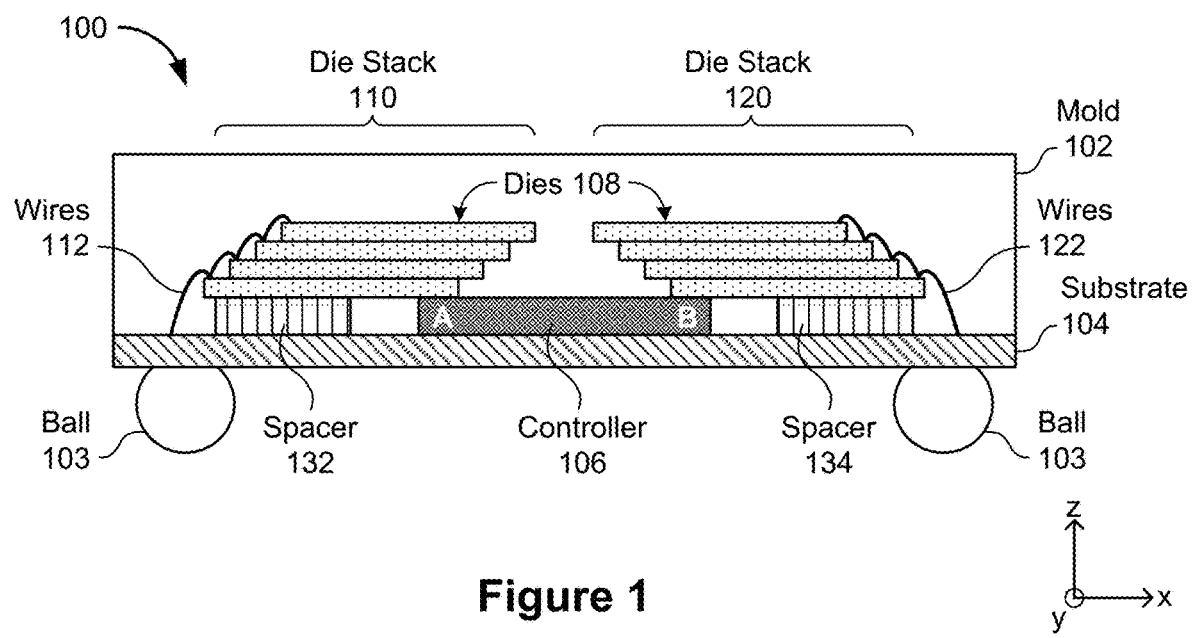
FIG. 1 is a cross-sectional side view of a portion of a semiconductor memory package including a substrate, a controller, and two stacks of memory dies in accordance with some implementations.

FIG. 1 is a cross-sectional side view of a portion of a semiconductor memory package 100 including a substrate 104, a controller 106, and two stacks 110 and 120 of semiconductor memory dies 108, all encapsulated in a mold compound 102. Mold compound 102 may include, for example, an epoxy molding compound (EMC) or other encapsulant material known in the art.

Package 100 may be any type of semiconductor device, such as a system-in-package (SiP). In one nonlimiting example, package 100 is a storage device (e.g., a secure digital (SD) card or a MultiMediaCard (MMC)) and the memory dies 108 are NAND memory dies.

Substrate 104 is both a mechanical base support of package 100 and an electrical interface that provides access to the memory dies 108 housed within the package. The electrical interface includes a plurality of metal layers within the substrate, including at least one layer for routing data using conductive (e.g., copper) traces, a ground layer, and/or a power layer. The plurality of metal layers include at least (i) a top layer in electrical contact with controller 106 and bond wires 112 and 122, and upon which controller 106 and other elements are mounted, and (ii) a bottom layer in electrical contact with solder balls 103, through which signals are routed between memory dies 108 and circuit elements outside package 100.

Controller 106 may be an application-specific integrated circuit (ASIC), or any other type of controller. Controller 106 is electrically coupled to the top layer of substrate 104. In some implementations, controller 106 may be mounted using flip chip mounting.

Controller 106 includes at least one bonding pad on a first side A and at least one bonding pad on a second side B opposite the first. As used herein, "first side A" refers to a side of controller 106 that is adjacent to, is closest to, or is otherwise neighboring a first die stack (e.g., die stack 110), and "second side B" refers to a side of the controller 106 that is adjacent to, is closest to, or is otherwise neighboring a second die stack (e.g., die stack 120). In some implementations, controller 106 includes four bonding pads, with two on each side. In general, controller 106 may include any number of bonding pads on the first side A and/or the second side B.

Spacers 132 and 134 allow die stacks 110 and 120 to be mounted closer to the center of package 100, thus allowing for reduced x-y dimensions of the package.

Semiconductor memory dies 108 may be integrated circuits configured for data storage. In some implementations, memory dies 108 are Not AND (NAND) flash memory dies, each comprising a plurality of NAND memory cells. In other implementations, memory dies 108 may each comprise a plurality of other types of memory cells, such as Not OR (NOR) memory cells.

The use of two die stacks in a side-by-side configuration (one on each side of the controller 106) allows more memory dies 108 to be electrically coupled to the controller 106 than if there was a single die stack, without expanding the package size in the x-y directions and/or the z-direction. Such a configuration optimizes routing between the bond wires (112 and 122) and channels on both sides of the controller 106. For example, bond wires 112 coupled to memory dies in stack 110 may be coupled to communication lines in substrate 104 that are routed to one or more bonding pads on side A of controller 106, and bond wires 122 coupled to memory dies in stack 120 may be coupled to communication lines in substrate 104 that are routed to one or more bonding pads on side B of controller 106. Here the term channel refers to an external connection to the controller, such as a memory die bonding pad, and the term communication line refers to metal traces within the substrate that are used to route signals between the memory dies 108 and the controller 106 and external devices (not shown).

To conserve even more space in the x-direction and shrink the package without decreasing storage capacity, controller 106 may be moved to one of the die stacks, and the other of the die stacks may be supplemented with one or more additional memory dies 108. In some such implementations, one of spacers 132 or 134 may be replaced with controller 106, while the other one of spacers 132 or 134 may be replaced by the one or more additional memory dies 108. Having one or more additional memory dies 108 allows for increased storage capacity. As a result, there are an unequal number of memory dies 108 in each of the two die stacks. Such a configuration may be referred to as an unbalanced stackup of memory dies, a semiconductor memory package having unbalanced die stacks, or unbalanced stacking of memory dies. Example implementations of such a configuration are described below with reference to FIGS. 2-9.

Figure 2:
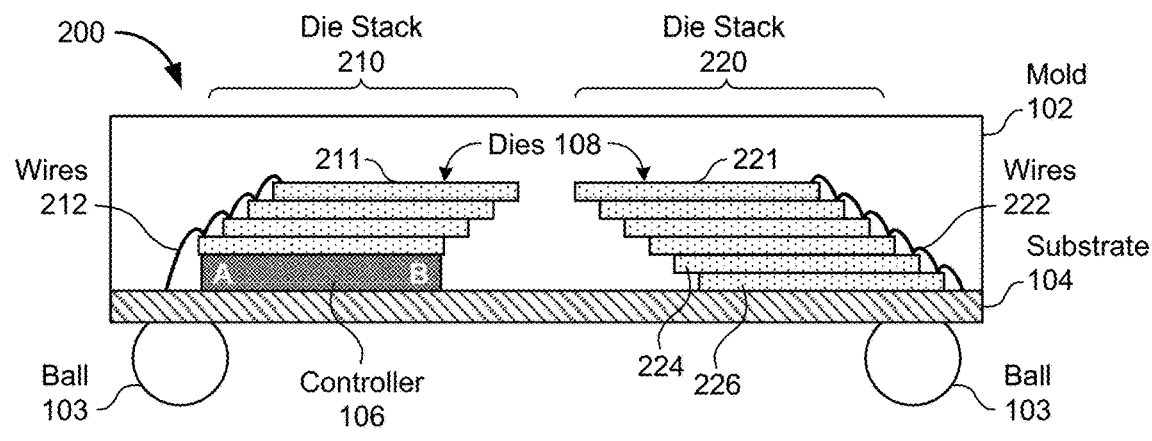
FIG. 2 is a cross-sectional side view of a portion of a semiconductor memory package including a substrate, a controller, and two unbalanced stacks of memory dies in accordance with some implementations.

FIG. 2 is a cross-sectional side view of a portion of a semiconductor memory package 200 including a substrate 104, a controller 106, and two unbalanced stacks 210 and 220 of memory dies 108 in accordance with some implementations.

Die stack 210 includes controller 106, which is electrically coupled to and mounted on substrate 104, and a first stack of memory dies 108 mounted on the controller 106. In some implementations, no spacer is present in die stack 210 or between memory dies 108 and substrate 104. According to the present disclosure, the controller 106 is mounted on and electrically coupled to the top surface of the substrate 104. In some implementations, the controller 106 may be a flip-chip die, coupled to the substrate 104 with solder balls (not shown). In some implementations, the controller 106 may be a wire-bond die, coupled to the substrate 104 with bond wires. In some implementations, a WEF (Wire Embedded Film) may separate the controller 106 and the memory die 108 that is mounted on top of the controller 106.

Each memory die 108 in stack 210 is electrically coupled to substrate 104 with bond wires 212. In this example, there are four memory dies 108 in stack 210. In other implementations, there may be any number of memory dies in stack 210, from a minimum of one memory die to a maximum of N memory dies, where N represents the number of memory dies it would take for the stack to reach the top of the usable area within the package.

Die stack 220 includes a second stack of memory dies 108 mounted on substrate 104. Each memory die 108 in stack 220 is electrically coupled to substrate 104 with bond wires 222. In some implementations, no spacer is present in die stack 220 or between memory dies 108 and substrate 104. In some implementations, memory dies 108 of die stack 220 are not mounted on controller 106. In this example, there are six memory dies 108 in stack 220. In other implementations, there may be any number of memory dies in stack 220, such as M memory dies, where M represents the number of memory dies it would take for the stack to reach the top of the usable area within the package. For example, M may equal N+P, where N is the number of memory dies in stack 210, and P is the number of memory dies that may be added to stack 220 to bring the height of the stack up to the top of the usable area within the package. In the example depicted in FIGS. 2, N=4, P=2, and M=6. Stated another way, by moving controller 106 to stack 210, and eliminating the spacers 132, 134 (FIG. 1), stack 220 may be supplemented with, for example, two additional memory dies 224 and 226. Other integers for N, P, and M may be used for other implementations, depending on package height requirements and the thickness of the memory dies 108. By having more memory dies in stack 220 (e.g., memory dies 224 and 226), package 200 has increased storage capacity without compromising on the outline (size) of the package. For example, the overall height (dimension in the z-direction) of semiconductor memory package 200 may be the same as the overall height semiconductor memory package 100 while having more memory dies and storage capacity.

In the presently preferred embodiments, the top surfaces 211 and 221 of the die stacks 210 and 220 are coplanar or substantially coplanar. Stated another way, the heights of the die stacks 210 and 220 from the substrate 104 are the same or substantially equal. This maximizes storage capacity for a given volume of internal package space. More details regarding this feature are discussed below with reference to FIGS. 5-6.

In the configuration depicted in FIG. 2, the memory dies in stack 210 may send and receive signals to and from one or more bonding pads on side A of controller 106 with bond wires 212 and conductive (e.g., copper) traces in the substrate 104 in the area to the left of the controller in the figure, and the memory dies in stack 220 may send and receive signals to and from one or more bonding pads on side B of controller 106 with bond wires 222 and conductive (e.g., copper) traces in the substrate 104 in the area to the right of the controller in the figure. As storage capacity (e.g., the number of memory dies) increases, the number of bonding pads (and corresponding channels) of the controller tends to increase, which causes routing complexity to increase. Thus, in some implementations, the memory dies 108 may be implemented in other configurations that optimize routing of bond wires and substrate traces, as described below with reference to FIGS. 3-4.

Figure 3:
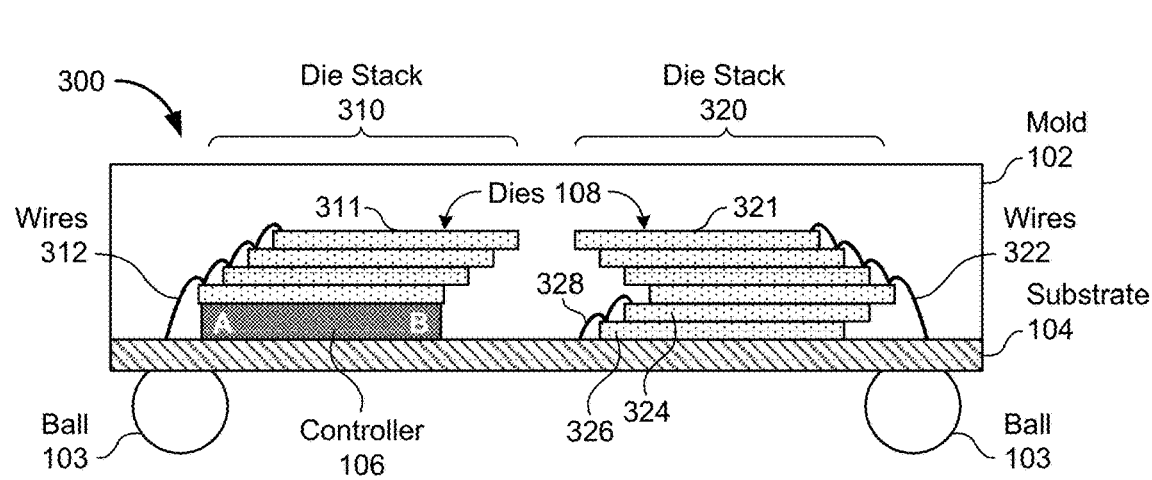
FIG. 3 is a cross-sectional side view of a portion of a semiconductor memory package including a substrate, a controller, and two unbalanced stacks of memory dies with one stack having bond wires on both sides in accordance with some implementations.

FIG. 3 is a cross-sectional side view of a portion of a semiconductor device package 300 including a substrate 104, a controller 106, and two unbalanced stacks 310 and 320 of memory dies 108 with one stack (320) having bond wires 322 and 328 on both sides in accordance with some implementations.

Die stack 310 includes controller 106, which is electrically coupled to and mounted on substrate 104, and a first stack of memory dies 108 mounted on the controller 106. In some implementations, no spacer is present in die stack 310 or between memory dies 108 and substrate 104. Each memory die in stack 310 is electrically coupled to substrate 104 with bond wires 312. In this example, there are four memory dies 108 in stack 310. In other implementations, there may be any number of memory dies in stack 310, from a minimum of one memory die to a maximum of N memory dies, where N represents the number of memory dies it would take for the stack to reach the top of the usable area within the package.

Die stack 320 includes a second stack of memory dies 108 mounted on substrate 104. In some implementations, no spacer is present in die stack 320 or between memory dies 108 and substrate 104. In some implementations, memory dies 108 of die stack 320 are not mounted on controller 106. A first subset of memory dies in stack 320 are electrically coupled to substrate 104 with bond wires 322, and a second subset of memory dies in stack 320 (memory dies 324 and 326) are electrically coupled to substrate 104 with bond wires 328. Bond wires 322 and 328 are coupled to opposite sides of the stack. This may be implemented by rotating memory dies in the second subset 180 degrees, so their bond wire hookups are disposed on the opposite side of the stack compared to the bond wire hookups for memory dies in the first subset. In this example, there are six memory dies 108 in stack 320, with four memory dies in the first subset and two memory dies in the second subset. In other implementations, there may be any number of memory dies in stack 320, such as M memory dies, where M represents the number of memory dies it would take for the stack to reach the top of the usable area within the package. For example, M may equal N+P, where N is the number of memory dies in stack 310, and P is the number of memory dies that may be added to stack 320 to bring the height of the stack up to the top of the usable area within the package. In the example depicted in FIGS. 3, N=4, P=2, and M=6. Other integers for N, P, and M may be used for other implementations, depending on package height requirements and the thickness of the memory dies 108. In addition, any number of memory dies may be included in the first and second subsets of memory dies, with the numbers (two and four) depicted in the figure being illustrative.

In some implementations, memory dies in stack 310 send and receive signals to and from one or more bonding pads on side A of controller 106 with bond wires 312, memory dies in the first subset of stack 320 send and receive signals to and from one or more bonding pads on side B of controller 106 with bond wires 322, and memory dies in the second subset of stack 320 (e.g., memory dies 324 and 326) send and receive signals, using bond wires 328, to and from (i) one or more bonding pads on side A of controller 106, or (ii) one or more bonding pads on side B of controller 106 not being used for communications with memory dies in the first subset of stack 320. For example, memory dies in the first subset of stack 320 may send and receive signals to and from a first bonding pad on side B of controller 106 using bond wires 322, and memory dies in the second subset of stack 320 may send and receive signals to and from a second bonding pad on side B of controller 106 using bond wires 328.

By rotating the second subset of memory dies so that the corresponding bond wires 328 are directed towards the center of the package, there may be fewer routing constraints associated with the second die stack 320. For example, if by adding memory dies 324 and 326 to stack 320 increases routing complexity to an extent that package size may need to be increased to accommodate a larger substrate, the additional memory dies (e.g., 324 and 326) may be rotated so that their bond wires 328 and associated routing in the substrate do not conflict or otherwise interfere to as great an extent with bond wires 322 and associated routing on the other side of the stack.

In addition, by rotating the second subset of memory dies so that the corresponding bond wires 328 are directed towards the center of the package, the length of the communication lines in the substrate that correspond to the bond wires of the lower memory dies in stack 320 may be reduced. Specifically, rather than routing data from controller 106 all the way to bond wires 222 at the edge of substrate 104 (as depicted for memory dies 224 and 226 in FIG. 2), such data may be routed to bond wires 328 towards the center of the package (as depicted for memory dies 324 and 326 in FIG. 3). This decreases the length of the traces in substrate 104 used for routing data between controller 106 and the bottom two memory dies in stack 320, which shortens the channel length (the length of the metal traces between bond wires and bonding pads) for these memory dies, thereby reducing impedance issues and cross talking on the channel.

To maximize storage capacity for a given volume of internal package space, in some implementations, the top surfaces 311 and 321 of the die stacks 310 and 320 are coplanar or substantially coplanar. Stated another way, the heights of the die stacks 310 and 320 from the substrate 104 are the same or substantially equal. More details regarding this feature are discussed below with reference to FIGS. 5-6.

Figure 4:
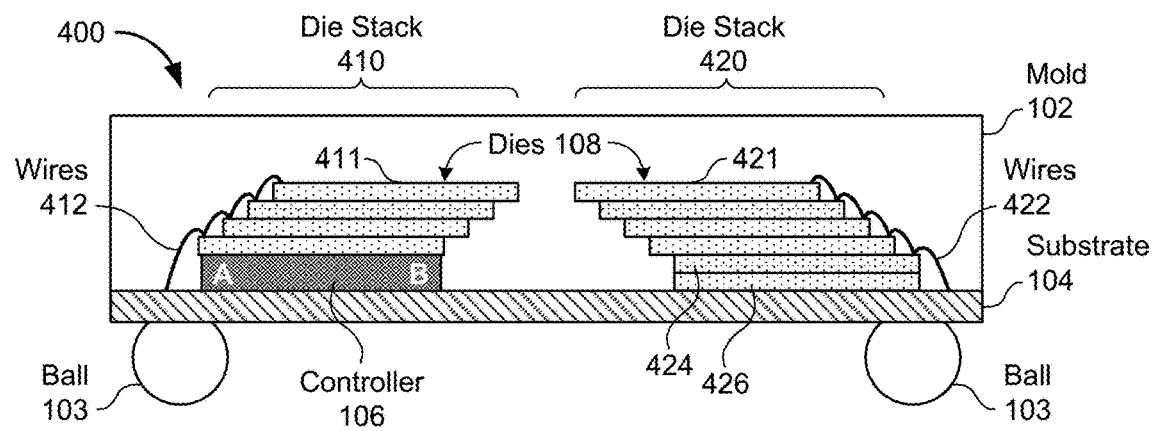
FIG. 4 is a cross-sectional side view of a portion of a semiconductor memory package including a substrate, a controller, and two unbalanced stacks of memory dies with one stack including adjacent memory dies sharing bond wires in accordance with some implementations.

FIG. 4 is a cross-sectional side view of a portion of a semiconductor memory package 400 including a substrate 104, a controller 106, and two unbalanced stacks 410 and 420 of memory dies 108 with one stack including adjacent memory dies 424 and 426 sharing bond wires and routing material in accordance with some implementations.

Die stack 410 includes controller 106, which is electrically coupled to and mounted on substrate 104, and a first stack of memory dies 108 mounted on the controller 106. In some implementations, no spacer is present in die stack 410 or between memory dies 108 and substrate 104. Each memory die in stack 410 is electrically coupled to substrate 104 with bond wires 412. In this example, there are four memory dies 108 in stack 410. In other implementations, there may be any number of memory dies in stack 410, from a minimum of one memory die to a maximum of N memory dies, where N represents the number of memory dies it would take for the stack to reach the top of the usable area within the package.

Die stack 420 includes a second stack of memory dies 108 mounted on substrate 104. In some implementations, no spacer is present in die stack 420 or between memory dies 108 and substrate 104. In some implementations, memory dies 108 of die stack 420 are not mounted on controller 106. The memory dies in stack 420 are electrically coupled to substrate 104 with bond wires 422. A subset of memory dies in stack 420 (memory dies 424 and 426) are aligned and stacked on top of each other, thereby reducing the amount of space required in the x-direction required by stack 420, which reduces the channel length (the length of the metal traces between bond wires and bonding pads) for the bottom memory dies in the stack. In some implementations, memory die 424 and memory die 426 are vertically disposed with no horizontal offset relative to each other. Memory dies 424 and 426 may be sized and positioned such that, for example, neither memory die 424 nor memory die 426 extends past the other in an x- and/or y-direction. The smaller channel length reduces impedance and cross-talking issues as described above with reference to FIG. 3. The memory dies in the vertically stacked subset (memory dies 424 and 426) share bond wires and routing material (e.g., in an area between the memory dies). Stated another way, each memory die 424 and 426 includes (i) memory cells for supporting storage functions of the memory die, and (ii) routing material for supporting combined electrical coupling to substrate 104 for the instant memory die and a neighboring memory die using bond wires 422.

There may be any number of memory dies in stack 420, such as M memory dies, where M represents the number of memory dies it would take for the stack to reach the top of the usable area within the package. For example, M may equal N+P, where N is the number of memory dies in stack 410, and P is the number of memory dies that may be added to stack 420 to bring the height of the stack up to the top of the usable area within the package. In the example depicted in FIGS. 4, N=4, P=2, and M=6. Other integers for N, P, and M may be used for other implementations, depending on package height requirements and the thickness of the memory dies 108. In addition, any number of memory dies may be included in the subset of vertically stacked memory dies, with the numbers (two) depicted in the figure being illustrative.

In some implementations, memory dies in stack 410 communicate with (send and receive signals to and from) one or more bonding pads on side A of controller 106 with bond wires 412, and memory dies in stack 420 communicate with (send and receive signals to and from) one or more bonding pads on side B of controller 106 with bond wires 422.

By combining a subset of memory dies (e.g., 424 and 426) in a vertical stack, there may be fewer bond wires 422 and, therefore, fewer routing constraints associated with the second die stack 420. For example, if by adding memory dies 424 and 426 to stack 420 increases routing complexity to an extent that package size may need to be increased to accommodate a larger substrate, the additional memory dies (e.g., 424 and 426) may be combined so that they are electrically coupled to a single set of bond wires 422 for two memory dies in the subset.

To maximize storage capacity for a given volume of internal package space, the top surfaces 411 and 421 of the die stacks 410 and 420 are coplanar or substantially coplanar. Stated another way, the heights of the die stacks 410 and 420 from the substrate 104 are the same or substantially equal. More details regarding this feature are discussed below with reference to FIGS. 5-6.

Figure 5:
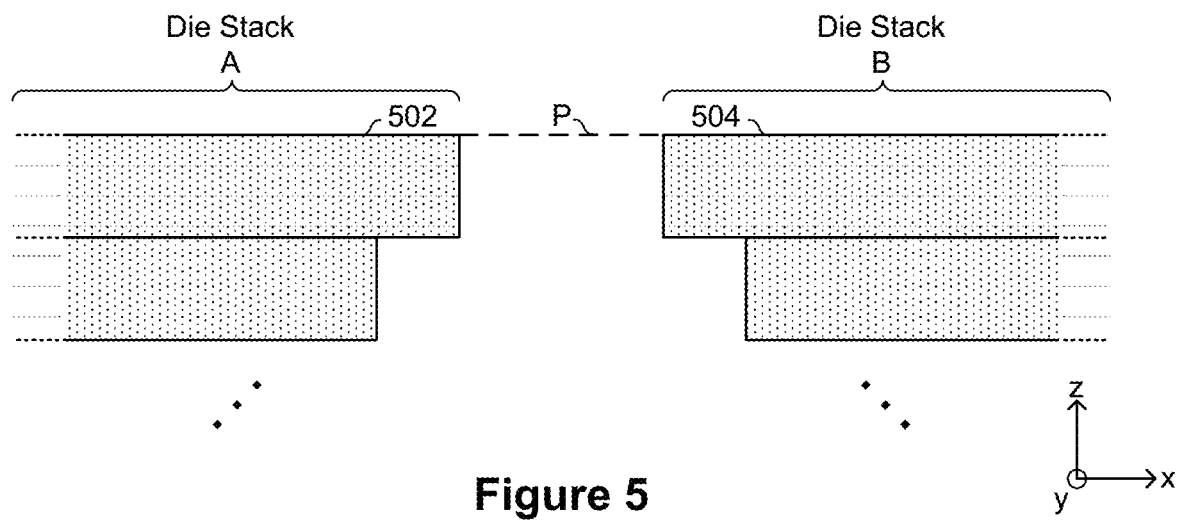
FIGS. 5-6 are detailed and enlarged views of the top surfaces of the semiconductor memory package as shown in any of FIGS. 2-4 in accordance with some implementations.
Figure 6:
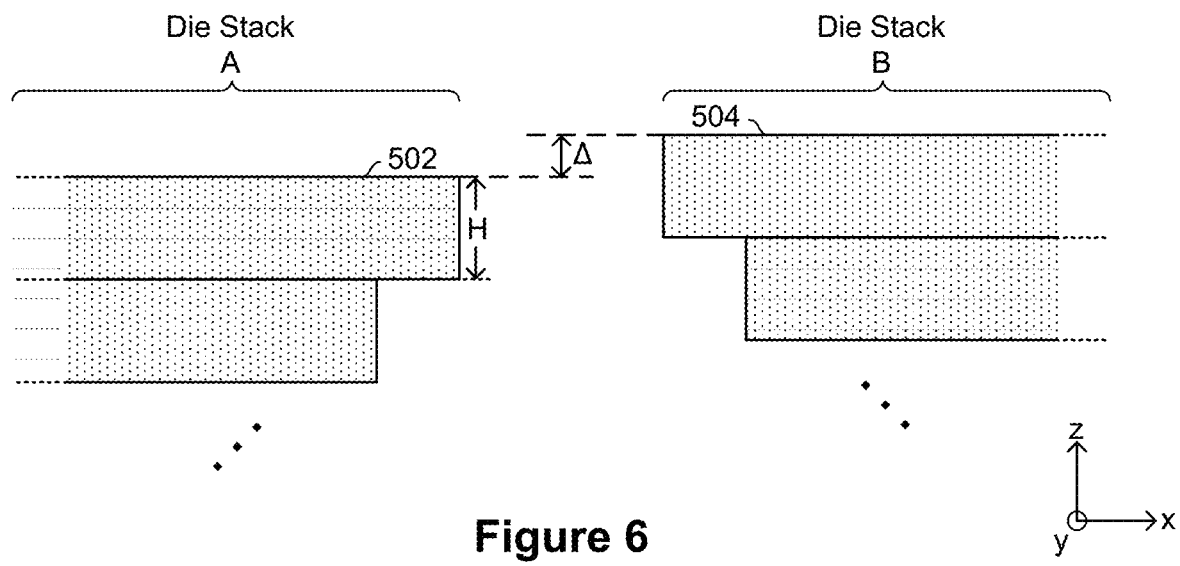

FIGS. 5-6 are detailed and enlarged views of the top surfaces of the semiconductor memory package as shown in any of FIGS. 2-4 in accordance with some implementations. Specifically, surface 502 in FIGS. 5-6 may correspond to surface 211, 311, or 411 in FIGS. 2-4, and surface 504 in FIGS. 5-6 may correspond to surface 221, 321, or 421 in FIGS. 2-4. Likewise, die stack A in FIGS. 5-6 may correspond to die stack 210, 310, or 410 in FIGS. 2-4, and die stack B in FIGS. 5-6 may correspond to die stack 220, 320, or 420 in FIGS. 2-4.

In FIG. 5, each die stack is the same height. As such, the top memory dies in each stack, or more specifically, top surfaces 502 and 504 are coplanar. As used herein, the term coplanar means two surfaces lying in the same plane (depicted as plane P).

In FIG. 6, each die stack is substantially the same height. As such, the top memory dies in each stack, or more specifically, top surfaces 502 and 504 are substantially coplanar. As used herein, substantially the same height and substantially coplanar mean the height difference (depicted as offset Δ) between the top surfaces 502 and 504 of the top memory dies in each stack is less than the thickness H of either of the top two memory dies. In some implementations, for example, the die stacks are configured such that Δ is equal to or less than half of thickness H. If the height difference (Δ) is greater than thickness H, then another memory die could have been added to the lower stack to take advantage of the available interior space of the package and optimize storage capacity.

Figure 7:
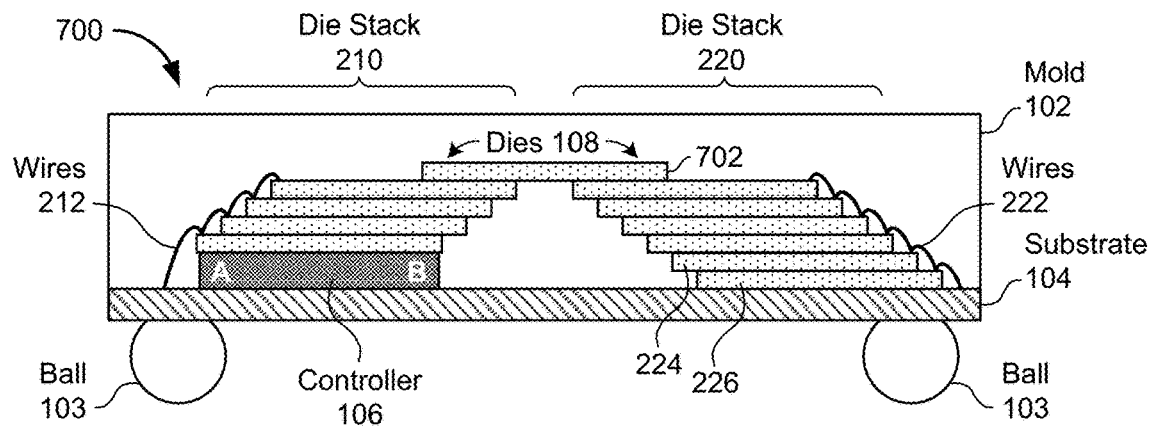
FIGS. 7-9 are cross-sectional side views of the portions of semiconductor memory packages respectively shown in FIGS. 2-4 with an additional bridge memory die in accordance with some implementations.
Figure 8:
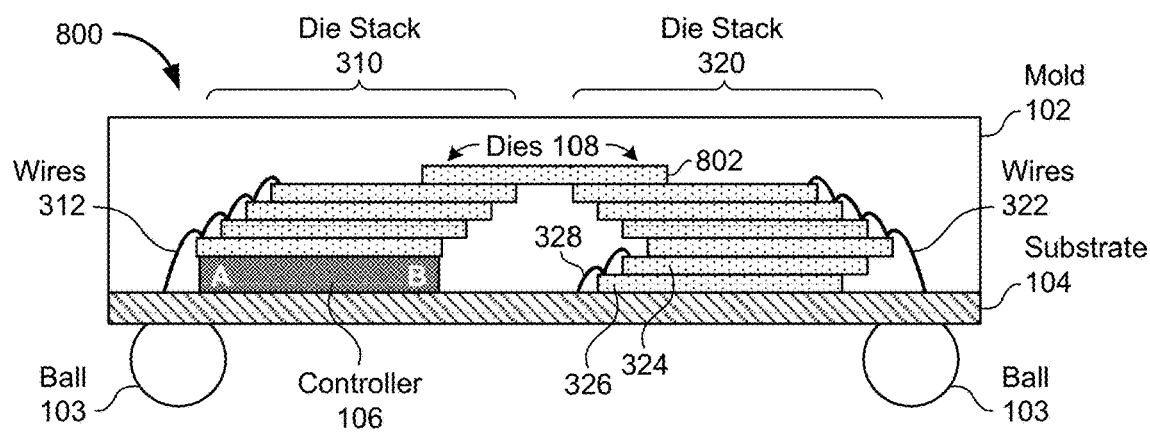
Figure 9:
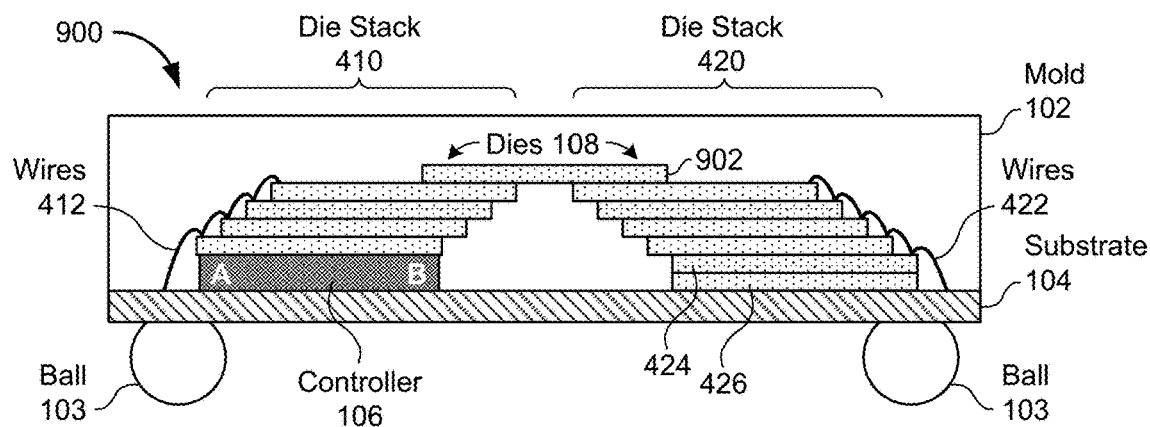

FIGS. 7-9 are cross-sectional side views of the portions of semiconductor memory packages respectively shown in FIGS. 2-4 with an additional bridge memory die in accordance with some implementations.

In some implementations, an additional memory die (702, 802, 902) may be mounted on top of the two memory dies stacks (210/220, 310/320, 410/420) such that a first portion of the additional memory die is mounted on one stack and a second portion of the additional memory die is mounted on the other stack. In some implementations, the additional memory die may be added when the two die stacks have the same height (as depicted in FIG. 5).

In FIGS. 7-9, package 700 (FIG. 7) corresponds to package 200 (FIG. 2), package 800 (FIG. 8) corresponds to package 300 (FIG. 3), and package 900 (FIG. 9) corresponds to package 400 (FIG. 4). The additional memory die (702, 802, 902) bridges the two stacks, and may be referred to as a bridge memory die. Based on package geometry and available internal space, the additional memory die may be added in order to further increase storage capacity of the package without compromising on the outline (size) of the package.

In the implementations described above with reference to FIGS. 2-9, the silicon ratio may be maintained across each die stack. Stated another way, the ratio of the amount of silicon in each die stack may be balanced. For example, the amount of silicon in stack 210 may be substantially the same (e.g., within 10%) as the amount of silicon in stack 220 for package 200. By maintaining substantially the same silicon ratio across each stack in a pair of stacks, stresses on the package are uniform, which increases robustness of the package. Further benefits of a balanced silicon ratio include even mold flow, reduced warpage, and uniform thermals across the package.

In the implementations described above with reference to FIGS. 2-9, the wire pitch of the bond wires may be maintained across each die stack. For example, the wire pitch for bond wires 212 of stack 210 may be substantially the same (e.g., within 10%) as the wire pitch for bond wires 222 of stack 220 for package 200. By maintaining substantially the same wire pitch across each stack in a pair of stacks, uniformity of the routing throughout the package may be maintained, which increases robustness of the package.

In the implementations described above with reference to FIGS. 2-9, the memory dies in each stack may have different thicknesses. For example, one or more base memory dies (on the bottom of a stack closest to the substrate) may be thicker than one or more ceiling memory dies (on the top of a stack). In another example, a middle memory die may be configured to be a transition memory die between bottom memory dies and top memory dies. Such a middle memory die may have more wire bonds than the other memory dies in the stack, causing the middle memory die to be thicker. In some implementations, the thicknesses of memory dies may vary between 60 microns (e.g., for a bottom memory die) and 40 microns (e.g., for a top memory die). In other implementations, memory dies having other thicknesses (greater or less than 60 microns, or greater or less than 40 microns) may be used. For implementations in which memory dies in a stack have different thicknesses, the different thicknesses can be mixed and matched so that the two stacks in a given package are the same height or substantially the same height, thereby maximizing storage capacity for a given package size.

Thus, in order to maximize storage capacity for a semiconductor memory package without increasing the package size, the package may include a substrate (e.g., 104), a first stack of memory dies (e.g., 210, 310, or 410), and a second stack of memory dies (e.g., 220, 320, or 420). The first stack of memory dies is electrically coupled to a top layer of the substrate and includes a first number of memory dies. The second stack of memory dies is electrically coupled to the top layer of the substrate and includes a second number of memory dies greater than the first number of memory dies. An upper surface of the first stack of memory dies (e.g., 211, 311, or 411) and an upper surface of the second stack of memory dies (e.g., 221, 321, or 421) are coplanar or substantially coplanar (e.g., as described above with reference to FIGS. 5-6).

In some implementations, the semiconductor memory package further includes a controller (e.g., 106) mounted on and electrically coupled to the top layer of the substrate. In some implementations, the controller is included in only one of the die stacks. For example, the controller is included in the first stack of memory dies.

In some implementations, the first stack of memory dies includes a bottom memory die mounted on the controller and a top memory die having an upper surface (e.g., 211, 311, or 411) that is coplanar or substantially coplanar with the upper surface (e.g., 221, 321, or 421) of the second stack of memory dies.

In some implementations, the controller includes a first bonding pad disposed on a first side of the controller (e.g., side A) and a second bonding pad disposed on a second side of the controller (e.g., side B) opposite the first side of the controller, and the first stack of memory dies is electrically coupled to the first bonding pad of the controller with a first plurality of bond wires (e.g., 212, 312, or 412).

In some implementations, the second stack of memory dies is electrically coupled to the second bonding pad of the controller with a second plurality of bond wires (e.g., 222).

In some implementations, a first subset of the second stack of memory dies (e.g., the top four memory dies in stack 320) is electrically coupled to the second bonding pad of the controller with a second plurality of bond wires (e.g., 322), a second subset of the second stack of memory dies (e.g., the bottom two memory dies in stack 320) is electrically coupled to the first bonding pad of the controller with a third plurality of bond wires (e.g., 328), and the second plurality of bond wires and the third plurality of bond wires are disposed on opposite sides of the second stack of memory dies.

In some implementations, a first subset of the second stack of memory dies (e.g., the top four memory dies in stack 320) is electrically coupled to the second bonding pad of the controller with a second plurality of bond wires (e.g., 322), a second subset of the second stack of memory dies (e.g., the bottom two memory dies in stack 320) is electrically coupled to the second bonding pad of the controller (or to a third bonding pad of the controller on side B) with a third plurality of bond wires (e.g., 328), and the second plurality of bond wires and the third plurality of bond wires are disposed on opposite sides of the second stack of memory dies.

In some implementations, a first subset of the second stack of memory dies (e.g., the top four memory dies in stack 320) is electrically coupled to the top layer of the substrate with a first plurality of bond wires (e.g., 322), a second subset of the second stack of memory dies (e.g., the bottom two memory dies in stack 320) is electrically coupled to the top layer of the substrate with a second plurality of bond wires (e.g., 328), and the first plurality of bond wires and the second plurality of bond wires are disposed on opposite sides of the second stack of memory dies.

In some implementations, the first stack of memory dies (e.g., 310) is vertically stacked in a first diagonal direction (e.g., towards the upper right of FIG. 3), a first subset of the second stack of memory dies (e.g., the top four memory dies of stack 320) is vertically stacked in a second diagonal direction opposite the first diagonal direction (e.g., towards the upper left of FIG. 3), and a second subset of the second stack of memory dies (e.g., the bottom two memory dies of stack 320) is vertically stacked in the first diagonal direction (e.g., towards the upper right of FIG. 3).

In some implementations, the upper surface (e.g., 502) of the first stack of memory dies and the upper surface (e.g., 504) of the second stack of memory dies are offset by a distance (e.g., $\Delta$) that is smaller than a thickness (e.g., H) of a top memory die of the first stack of memory dies or a top memory die of the second stack of memory dies.

In some implementations, the first stack of memory dies has a first vertical height with respect to the top layer of the substrate (e.g., the distance in the z-direction between substrate 104 and surface 211, 311, or 411), the second stack of memory dies has a second vertical height with respect to the top layer of the substrate (e.g., the distance in the z-direction between substrate 104 and surface 221, 321, or 421), and a difference between the first vertical height and the second vertical height is smaller than a thickness (e.g., H) of a top memory die of the first stack of memory dies or a top memory die of the second stack of memory dies.

In some implementations, at least two adjacent memory dies (e.g., 424 and 426) of the second stack of memory dies are vertically disposed with no horizontal offset, an internal routing layer is vertically disposed between data storage portions of the at least two adjacent memory dies, and the at least two adjacent memory dies are electrically coupled to the top layer of the substrate with a single layer of bond wires (e.g., bond wires 422 connected to memory die 424).

In some implementations, the semiconductor memory package further includes a memory die (e.g., 702, 802, or 902) mounted on top of the first stack of memory dies and the second stack of memory dies.

In some implementations, the first stack of memory dies is mounted on a controller (e.g., 106), the first stack of memory dies and the controller have a first silicon ratio, and the second stack of memory dies has a second silicon ratio substantially equal to (e.g., within 10% of) the first silicon ratio.

In some implementations, the first stack of memory dies has a first bond wire pitch, and the second stack of memory dies has a second bond wire pitch substantially equal to (e.g., within 10% of) the first bond wire pitch.

In some implementations, the controller is an application-specific integrated circuit (ASIC) and the first stack and second stack include respective pluralities of NAND memory dies.

In another implementation, a semiconductor memory package includes a substrate (e.g., 104), a controller (e.g., 106), a first stack of memory dies (e.g., 210, 310, or 410), and a second stack of memory dies (e.g., 220, 320, or 420). The controller is mounted on and electrically coupled to a top layer of the substrate. The first stack of memory dies is electrically coupled to the top layer of the substrate and includes (i) a bottom memory die mounted on the controller and (ii) a top memory die having a first vertical distance (in the z-direction) from a top layer of the substrate. The second stack of memory dies is electrically coupled to the top layer of the substrate and includes (i) a bottom memory die mounted on a top layer of the substrate (e.g., 226, 326, or 426) and (ii) a top memory die having a second vertical distance (in the z-direction) from the top layer of the substrate. The second stack includes more memory dies than the first stack, and the first vertical distance and the second vertical distance are substantially equal (e.g., as described above with reference to FIGS. 5-6)

In another implementation, a semiconductor memory package includes a substrate (e.g., 104), a controller (e.g., 106), a first stack of memory dies (e.g., 310), and a second stack of memory dies (e.g., 320). The controller is mounted on and electrically coupled to a top layer of the substrate. The first stack of memory dies is mounted on the controller and includes first bonding means for electrically coupling the memory dies (e.g., 312) in the first stack to a top layer of the substrate. The second stack of memory dies is mounted on the top layer of the substrate and includes second bonding means for electrically coupling the memory dies (e.g., 322, 328) in the second stack to the top layer of the substrate. The second stack includes more memory dies than the first stack, the first bonding means are disposed about one side of the first stack, and the second bonding means are disposed about two opposite sides of the second stack.

In some implementations, a first plurality of the second bonding means (e.g., 322) electrically couple a first subset of memory dies in the second stack (e.g., the top four memory dies in stack 320) to a bonding pad on a first side (e.g., side B) of the controller, and a second plurality of the second bonding means (e.g., 328) electrically couple a second subset of memory dies in the second stack (e.g., the bottom two memory dies in stack 320) to a bonding pad on a second side of the controller (e.g., side A) opposite the first side.

In some implementations, a first plurality of the second bonding means (e.g., 322) electrically couple a first subset of memory dies in the second stack (e.g., the top four memory dies in stack 320) to a first bonding pad on a first side of the controller (e.g., bonding pad 1 on side B), and a second plurality of the second bonding means (e.g., 328) electrically couple a second subset of memory dies in the second stack (e.g., the bottom two memory dies in stack 320) to the first bonding pad, or to a second bonding pad on the first side of the controller (e.g., bonding pad 1, or bonding pad 2, on side B).

It will be appreciated by those skilled in the art that changes could be made to the exemplary embodiments shown and described above without departing from the broad inventive concepts thereof. It is understood, therefore, that this invention is not limited to the exemplary embodiments shown and described, but it is intended to cover modifications within the spirit and scope of the present invention as defined by the claims. For example, specific features of the exemplary embodiments may or may not be part of the claimed invention and various features of the disclosed embodiments may be combined. The words "right", "left", "lower" and "upper" designate directions in the drawings to which reference is made. The words "inwardly" and "outwardly" refer to directions toward and away from, respectively, the geometric center of the ball grid array having a multi-surface trace interface. Unless specifically set forth herein, the terms "a", "an" and "the" are not limited to one element but instead should be read as meaning "at least one".

It is to be understood that at least some of the figures and descriptions of the invention have been simplified to focus on elements that are relevant for a clear understanding of the invention, while eliminating, for purposes of clarity, other elements that those of ordinary skill in the art will appreciate may also comprise a portion of the invention. However, because such elements are well known in the art, and because they do not necessarily facilitate a better understanding of the invention, a description of such elements is not provided herein.

Further, to the extent that the methods of the present invention do not rely on the particular order of steps set forth herein, the particular order of the steps should not be construed as limitation on the claims. Any claims directed to the methods of the present invention should not be limited to the performance of their steps in the order written, and one skilled in the art can readily appreciate that the steps may be varied and still remain within the spirit and scope of the present invention.

What is claimed is:

1. A semiconductor memory package comprising:
   a substrate;
   a first stack of memory dies electrically coupled to a top layer of the substrate and including a first number of memory dies;
   a controller mounted on and electrically coupled to the top layer of the substrate and included in the first stack of memory dies; and
   a second stack of memory dies electrically coupled to the top layer of the substrate adjacent to the first stack of memory dies, and including a second number of memory dies greater than the first number of memory dies;
   wherein an upper surface of the first stack of memory dies and an upper surface of the second stack of memory dies are coplanar or substantially coplanar, and
   wherein a topmost memory die of the second stack of memory dies is horizontally offset relative to an adjacent memory die included the second stack of memory dies toward the first stack of memory dies.

2. The semiconductor memory package of claim 1, wherein the controller is an application-specific integrated circuit (ASIC) and the first stack and second stack include respective pluralities of NAND memory dies.

3. The semiconductor memory package of claim 1, wherein the first stack of memory dies includes a bottom memory die mounted on the controller and a top memory die having an upper surface that is coplanar or substantially coplanar with the upper surface of the second stack of memory dies.

4. The semiconductor memory package of claim 1, wherein:
- the controller includes a first memory die bonding pad disposed on a first side of the controller;
- the controller includes a second memory die bonding pad disposed on a second side of the controller opposite the first side of the controller; and
- a first plurality of bond wires electrically connect the first stack of memory dies to the first memory die bonding pad of the controller.

5. The semiconductor memory package of claim 4, wherein:
- a second plurality of bond wires electrically connect the second stack of memory dies to the second memory die bonding pad of the controller.

6. The semiconductor memory package of claim 4, wherein:
- a first subset of the second stack of memory dies is electrically coupled to the second memory die bonding pad of the controller with a second plurality of bond wires;
- a second subset of the second stack of memory dies is electrically coupled to the first memory die bonding pad of the controller with a third plurality of bond wires; and
- the second plurality of bond wires and the third plurality of bond wires are disposed on opposite sides of the second stack of memory dies.

7. The semiconductor memory package of claim 4, wherein:
- a first subset of the second stack of memory dies is electrically coupled to the second memory die bonding pad of the controller with a second plurality of bond wires;
- a second subset of the second stack of memory dies is electrically coupled to the second memory die bonding pad of the controller with a third plurality of bond wires; and
- the second plurality of bond wires and the third plurality of bond wires are disposed on opposite sides of the second stack of memory dies.

8. The semiconductor memory package of claim 1, wherein:
- a first subset of the second stack of memory dies is electrically coupled to the top layer of the substrate with a first plurality of bond wires;
- a second subset of the second stack of memory dies is electrically coupled to the top layer of the substrate with a second plurality of bond wires; and
- the first plurality of bond wires and the second plurality of bond wires are disposed on opposite sides of the second stack of memory dies.

9. The semiconductor memory package of claim 1, wherein:
- the first stack of memory dies is vertically stacked in a first diagonal direction;
- a first subset of the second stack of memory dies is vertically stacked in a second diagonal direction opposite the first diagonal direction; and
- a second subset of the second stack of memory dies is vertically stacked in the first diagonal direction.

10. The semiconductor memory package of claim 1, wherein the upper surface of the first stack of memory dies and the upper surface of the second stack of memory dies are offset by a distance that is smaller than a thickness of a top memory die of the first stack of memory dies or a top memory die of the second stack of memory dies.

11. The semiconductor memory package of claim 1, wherein:
- the first stack of memory dies has a first vertical height with respect to the top layer of the substrate;
- the second stack of memory dies has a second vertical height with respect to the top layer of the substrate; and
- a difference between the first vertical height and the second vertical height is smaller than a thickness of a top memory die of the first stack of memory dies or a top memory die of the second stack of memory dies.

12. The semiconductor memory package of claim 1, wherein the controller is a flip-chip die and a bottom most memory die of the first stack of memory dies is mounted directly on and generally centered on the controller.

13. A semiconductor memory package comprising:
- a substrate;
- a first stack of memory dies electrically coupled to a top layer of the substrate and including a first number of memory dies; and
- a second stack of memory dies electrically coupled to the top layer of the substrate adjacent to the first stack of memory dies, and including a second number of memory dies greater than the first number of memory dies;
- wherein an upper surface of the first stack of memory dies and an upper surface of the second stack of memory dies are coplanar or substantially coplanar, and at least two adjacent memory dies of the second stack of memory dies are vertically disposed with no horizontal offset,
- wherein an internal routing layer is vertically disposed between data storage portions of the at least two adjacent memory dies, and
- wherein the at least two adjacent memory dies are electrically coupled to the top layer of the substrate with a single layer of bond wires.

14. The semiconductor memory package of claim 1, further comprising an additional memory die including a first portion mounted on top of the first stack of memory dies and a second portion mounted on top of the second stack of memory dies.

15. The semiconductor memory package of claim 1, wherein:
- the first stack of memory dies is mounted on a controller;
- the first stack of memory dies and the controller have a first silicon ratio; and
- the second stack of memory dies has a second silicon ratio substantially equal to the first silicon ratio.

16. The semiconductor memory package of claim 1, wherein:
- the first stack of memory dies has a first bond wire pitch; and
- the second stack of memory dies has a second bond wire pitch substantially equal to the first bond wire pitch.

17. The semiconductor memory package of claim 13 further comprising:
- a controller mounted on and electrically coupled to the top layer of the substrate and included in the first stack of memory dies, and
- wherein the controller is a flip-chip die and a bottom most memory die of the first stack of memory dies is mounted directly on and generally centered on the controller.

18. A semiconductor memory package comprising:
- a substrate;
- a controller mounted on and electrically coupled to a top layer of the substrate;

a first stack of memory dies mounted on the controller and including first bonding means for electrically coupling the memory dies in the first stack to the top layer of the substrate;

a second stack of memory dies mounted on the top layer of the substrate adjacent to the controller and the first stack, and including second bonding means for electrically coupling the memory dies in the second stack to the top layer of the substrate;

wherein the second stack includes more memory dies than the first stack; and wherein the first bonding means are disposed about one side of the first stack, and the second bonding means includes a first bond wire electrically coupled to a bottom memory die of the second stack and positioned on a side of the second stack facing toward the first stack and a second bond wire positioned on a side of the second stack facing away from the first stack, the second bond wire being electrically coupled to a top memory die of the second stack.

19. The semiconductor memory package of claim 18, wherein:
a first subset of the second bonding means electrically couple a first subset of the memory dies in the second stack to a substrate bonding pad on a first side of the controller; and
a second subset of the second bonding means electrically couple a second subset of the memory dies in the second stack to a different substrate bonding pad on a second side of the controller opposite the first side.

20. The semiconductor memory package of claim 19, wherein top planar surfaces of the first and second stacks are co-planar.

* * * * *